(12) United States Patent
Zhao

(10) Patent No.: US 11,527,633 B2
(45) Date of Patent: Dec. 13, 2022

(54) TRENCH GATE DEVICE AND METHOD FOR MAKING THE SAME

(71) Applicant: SHANGHAI HUAHONG GRACE SEMICONDUCTOR MANUFACTURING CORPORATION, Shanghai (CN)

(72) Inventor: Longjie Zhao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/217,173

(22) Filed: Mar. 30, 2021

(65) Prior Publication Data

US 2022/0020858 A1    Jan. 20, 2022

(30) Foreign Application Priority Data

Jul. 16, 2020    (CN) .......................... 202010695546.9

(51) Int. Cl.
*H01L 29/423*    (2006.01)
*H01L 21/763*    (2006.01)
(Continued)

(52) U.S. Cl.
CPC ........ *H01L 29/4236* (2013.01); *H01L 21/763* (2013.01); *H01L 29/0653* (2013.01); *H01L 29/4983* (2013.01)

(58) Field of Classification Search
CPC ............. H01L 29/4236; H01L 29/0653; H01L 29/4983
See application file for complete search history.

(56) References Cited

U.S. PATENT DOCUMENTS 6,800,509 B1 * 10/2004 Lin .................. H01L 21/28202
                                                             438/270
9,530,867 B2 * 12/2016 Hsieh ................ H01L 21/28035
(Continued)

FOREIGN PATENT DOCUMENTS

CN      101060132 A    10/2007
CN      101180737 A     5/2008
CN      208422922 U     1/2019

OTHER PUBLICATIONS

Search Report issued in corresponding Chinese Patent Application No. 2020106955469, dated Oct. 25, 2021.
(Continued)

*Primary Examiner* — Eugene Lee
(74) *Attorney, Agent, or Firm* — Dilworth IP, LLC

(57) ABSTRACT

A method for manufacturing a trench gate device includes: forming a trench in a substrate with a super junction structure; forming a gate dielectric layer in the trench; forming a polysilicon gate by filling a portion of the trench with polysilicon; forming an intermediate dielectric layer in the trench; forming an auxiliary polysilicon layer by filling a gap in the trench with polysilicon; forming a source region of the trench gate device in the substrate; depositing an interlayer dielectric layer, and forming contacts in the interlayer dielectric layer, wherein the polysilicon gate, the auxiliary polysilicon layer, and the source region are led out from the contacts; and connecting the led-out auxiliary polysilicon layer to the led-out source region.

4 Claims, 4 Drawing Sheets

(51) Int. Cl.
    *H01L 29/06*     (2006.01)
    *H01L 29/49*     (2006.01)

(56) References Cited

U.S. PATENT DOCUMENTS

| | | | | |
|---|---|---|---|---|
| 9,923,066 | B2* | 3/2018 | Kueck | H01L 29/408 |
| 10,861,966 | B2* | 12/2020 | Feil | H01L 29/4236 |
| 10,868,113 | B2* | 12/2020 | Yedinak | H01L 29/7811 |
| 11,239,231 | B2* | 2/2022 | Katou | H01L 29/0696 |
| 2002/0060339 | A1* | 5/2002 | Maruoka | H01L 29/7813 |
| | | | | 257/329 |
| 2006/0214222 | A1* | 9/2006 | Challa | H01L 29/0661 |
| | | | | 257/E29.066 |
| 2006/0273385 | A1* | 12/2006 | Hshieh | H01L 24/83 |
| | | | | 438/270 |
| 2008/0067584 | A1* | 3/2008 | Lui | H01L 29/781 |
| | | | | 438/273 |
| 2008/0197361 | A1* | 8/2008 | Ueno | H01L 29/7722 |
| | | | | 257/77 |
| 2011/0156139 | A1* | 6/2011 | Hsieh | H01L 29/7811 |
| | | | | 257/E29.256 |
| 2013/0240985 | A1* | 9/2013 | Hirler | H01L 29/66734 |
| | | | | 438/270 |
| 2017/0084735 | A1* | 3/2017 | Takeuchi | H01L 29/157 |
| 2020/0168714 | A1* | 5/2020 | Oda | H01L 24/45 |
| 2021/0296453 | A1* | 9/2021 | Zheng | H01L 21/32133 |

OTHER PUBLICATIONS

Office Action issued in corresponding Chinese Patent Application No. 202010695546.9, dated Nov. 9, 2021.

* cited by examiner

TRENCH GATE DEVICE AND METHOD FOR MAKING THE SAME

CROSS-REFERENCES TO RELATED APPLICATIONS

This application claims the priority to Chinese patent application No. CN 202010695546.9 filed at CNIPA on Jul. 16, 2020, and entitled "TRENCH GATE DEVICE AND METHOD FOR MAKING CAPACITOR THE SAME", the disclosure of which is incorporated herein by reference in entirety.

TECHNICAL FIELD

The present application relates to the field of semiconductor manufacturing, in particular to a trench gate device and a method for manufacturing a trench gate device.

BACKGROUND OF THE INVENTION

The super junction is a MOSFET structure used to increase the reverse breakdown voltage of a device and maintain a relatively small on-resistance. The withstand voltage of a super junction product refers to a withstand voltage protection capability in the longitudinal direction provided by a depletion region formed by lateral depletion of a particular P pillar region and a nearby N-type epitaxial region.

With the development of technologies, the use of super junction devices becomes increasingly widespread. The requirement on semiconductor device integration becomes increasingly high, the device cell size is gradually reduced, and the device structure also changes with demand; in this case, the trench gate structure appears. Although devices with trench gate structures can achieve a faster switching speed and a lower switching loss, they are more susceptible to electromagnetic interference.

SUMMARY OF THE INVENTION

According to some embodiments in this application, a trench gate device is disclosed. A trench gate device includes: a substrate with a super junction structure, a trench gate structure formed in the substrate, and an interlayer dielectric layer on the surface of the substrate; the trench gate structure comprises a gate dielectric layer covering the bottom and sidewalls of a trench, a polysilicon gate at the inner side of the gate dielectric layer, an intermediate dielectric layer at the inner side of the polysilicon gate, and an auxiliary polysilicon layer at the inner side of the intermediate dielectric layer; in the substrate, a source region is formed at the outer side of the trench gate structure; contacts are formed in the interlayer dielectric layer, and the polysilicon gate, the auxiliary polysilicon layer, and the source region are respectively led out from the contacts; and the led-out auxiliary polysilicon layer is connected to the led-out source region.

In some examples, in the substrate, a well region is formed at the outer side of the trench gate structure, and the source region is on the top of the well region.

In some examples, the trench gate structure is formed in an N-type epitaxial region of the super junction structure.

In some examples, in the trench gate structure, the bottom of the trench to ¼ to ½ of the trench depth is fully filled with polysilicon gate.

According to some embodiments in this application, a method for manufacturing a trench gate device is disclosed in the following steps: forming a trench in a substrate with a super junction structure; forming a gate dielectric layer in the trench; forming a polysilicon gate by filling a portion of the trench with polysilicon; forming an intermediate dielectric layer in the trench; forming an auxiliary polysilicon layer by filling a gap in the trench with polysilicon; forming a source region of the trench gate device in the substrate; depositing an interlayer dielectric layer, and forming contacts in the interlayer dielectric layer, wherein the polysilicon gate, the auxiliary polysilicon layer, and the source region are led out from the contacts; and connecting the led-out auxiliary polysilicon layer to the led-out source region.

In some examples, forming a trench in a substrate with a super junction structure, comprising: forming the trench in an N-type epitaxial region of the super junction structure in the substrate.

In some examples, the gate dielectric layer is an oxide layer.

In some examples, forming a polysilicon gate by filling a portion of the trench with polysilicon, comprising: forming the polysilicon gate, by depositing polysilicon until the bottom of the trench to ¼ to ½ of the trench depth is fully filled with polysilicon.

In some examples, the forming a source region of the trench gate device in the substrate, comprising: forming a well region at the outer side of the trench; and forming the source region of the trench gate device on the top of the well region.

DETAILED DESCRIPTION EMBODIMENTS OF THE DISCLOSURE

Figure 1:
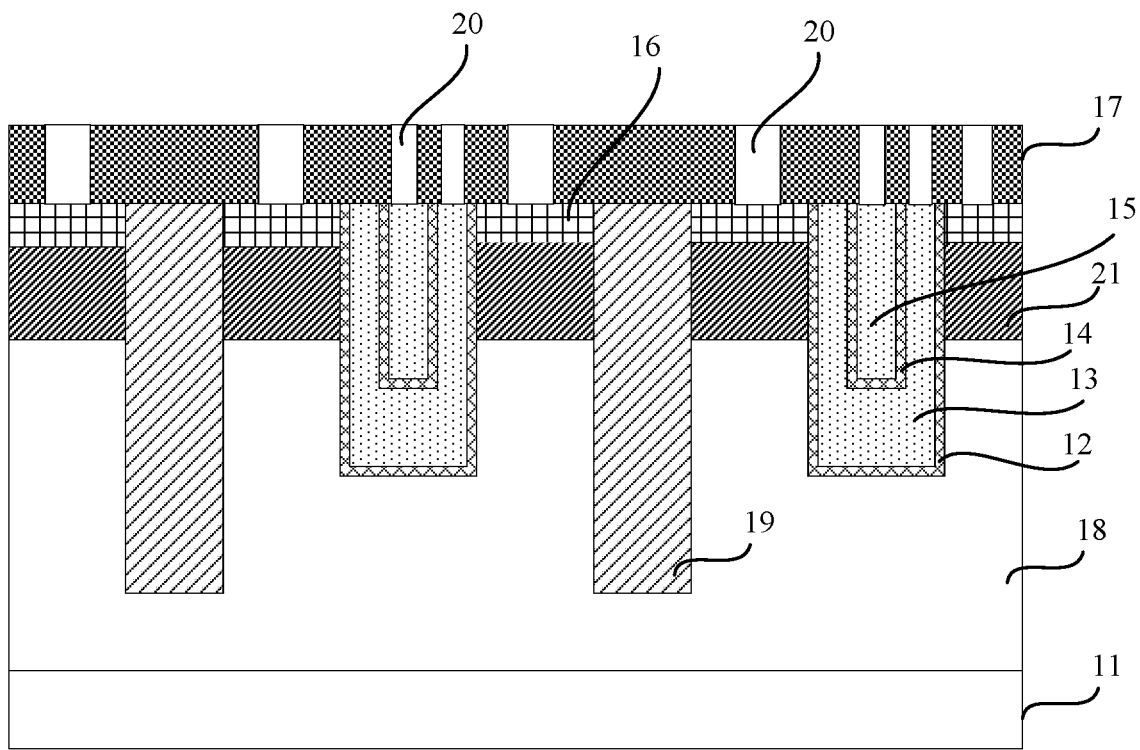
FIG. 1 shows the device cross sectional view of a trench gate device, according to one embodiment of the present application.

The technical solutions in this application will be clearly and completely described below with reference to the drawings. Obviously, the described embodiments are part of the embodiments of the application, instead of all them. Based on the embodiments in the present application, all other embodiments obtained by one skilled in the art without contributing any inventive labor shall fall into the protection scope of the present application.

In the description of this application, it should be noted that the orientation or positional relationship indicated by the terms "center", "upper", "lower", "left", "right", "vertical", "horizontal", "inside", "outside", or the like is based on the orientation or positional relationship shown in the drawings, is only for the convenience of describing this application and simplified description, and does not indicate or imply that the indicated device or element must have a specific orientation or be configured and operated in a specific orientation. Therefore, the orientation or positional relationship should not to be construed as limitations on the present application. In addition, the terms "first," "second," and "third" are used for descriptive purposes only, and should not be construed to indicate or imply relative importance.

In the description of this application, it should be noted that the terms "installation", "connected", and "connection" should be understood in a broad sense, unless explicitly stated and defined otherwise, for example, they may be fixed connection or removable connection, or integral connection; can be mechanical or electrical connection; can be direct connection, or indirect connection through an intermediate medium, or the internal communication of two elements, and can be wireless or wired connection. For those of ordinary skill in the art, the specific meanings of the above terms in this application can be understood in specific situations.

In addition, the technical features involved in the different implementations of the present application described below can be combined with each other as long as they do not conflict with each other.

According to one embodiment of the present application, a trench gate device includes at least a substrate with a super junction structure, a trench gate structure formed in the substrate, and an interlayer dielectric layer on the surface of the substrate.

FIG. 1 shows the device cross sectional view of a trench gate device, according to one embodiment of the present application, the trench gate structure includes a gate dielectric layer 12 covering the bottom and sidewalls of a trench, a polysilicon gate 13 at the inner side of the gate dielectric layer 12, an intermediate dielectric layer 14 at the inner side of the polysilicon gate 13, and an auxiliary polysilicon layer 15 at the inner side of the intermediate dielectric layer 14.

A sandwich structure composed of the polysilicon gate 13, the intermediate dielectric layer 14, and the auxiliary polysilicon layer 15 fully fills the trench.

In the substrate, a source region 16 is formed at the outer side of the trench gate structure. In some examples, the source regions are formed on two sides of the trench gate structure.

A second-type epitaxial layer 19 is formed in a first-type epitaxial layer 18 on the substrate 11, and the first type is opposite to the second type. The first-type epitaxial layer 18 and the second-type epitaxial layer 19 are alternately arranged to form the super junction structure.

In an example, the first-type epitaxial layer is an N-type epitaxial layer, and the second-type epitaxial layer is a P-type epitaxial layer.

Contacts 20 are formed in the interlayer dielectric layer 17, and the polysilicon gate 13, the auxiliary polysilicon layer 15, and the source region 16 are respectively led out from the contacts 20.

The led-out auxiliary polysilicon layer 15 is connected to the led-out source region 16.

Referring to FIG. 1, a well region 21 is formed at the outer side of the trench gate structure, and the source region 16 is on the top of the well region 21. A doping type of the source region 16 is opposite to that of the well region 21.

In some examples, the well regions are formed on two sides of the trench gate structure.

In some embodiments of the present application, the first-type epitaxial layer is an N-type epitaxial layer, and the second-type epitaxial layer is a P-type epitaxial layer, the N-type epitaxial layer and the P-type epitaxial layer are alternately arranged to form the super junction structure, and the trench gate structure is formed in an N-type epitaxial layer of the super junction structure.

In some embodiments of the present application, in the trench gate structure, the bottom of the trench to ¼ to ½ of the trench depth is fully filled with polysilicon gate; and the remaining space in the trench is filled by the polysilicon gate 13, the intermediate dielectric layer 14 and the auxiliary polysilicon layer 15.

In an example, in the trench gate structure, the bottom of the trench to ⅓ of the trench depth is fully filled with polysilicon gate; a space from the ⅓ of the trench depth to the top of the trench is filled by the polysilicon gate 13, the intermediate dielectric layer 14 and the auxiliary polysilicon layer 15.

Figure 2:
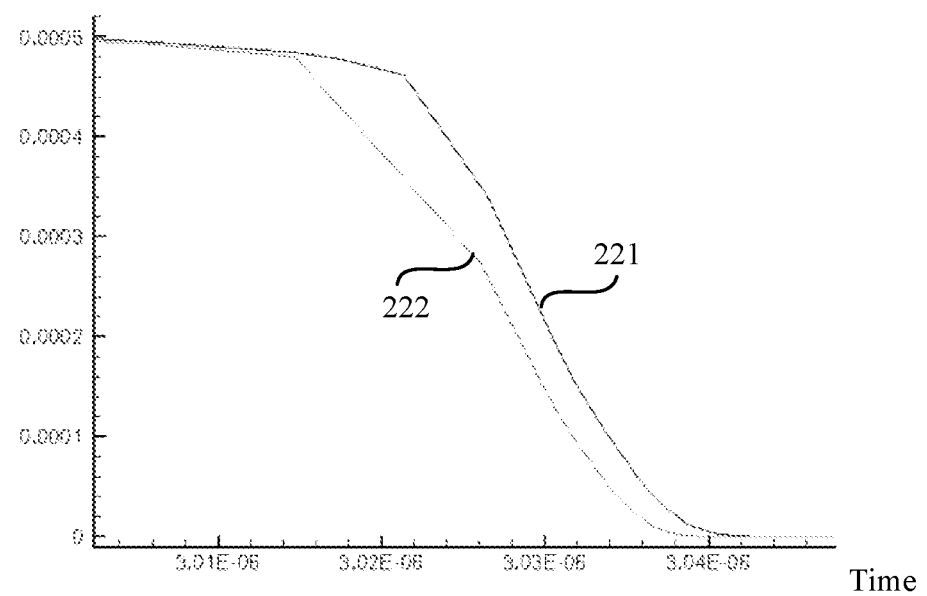
FIG. 2 is a schematic diagram of a relationship between the current and the time of the trench gate device, according to one embodiment of the present application.
Figure 3:
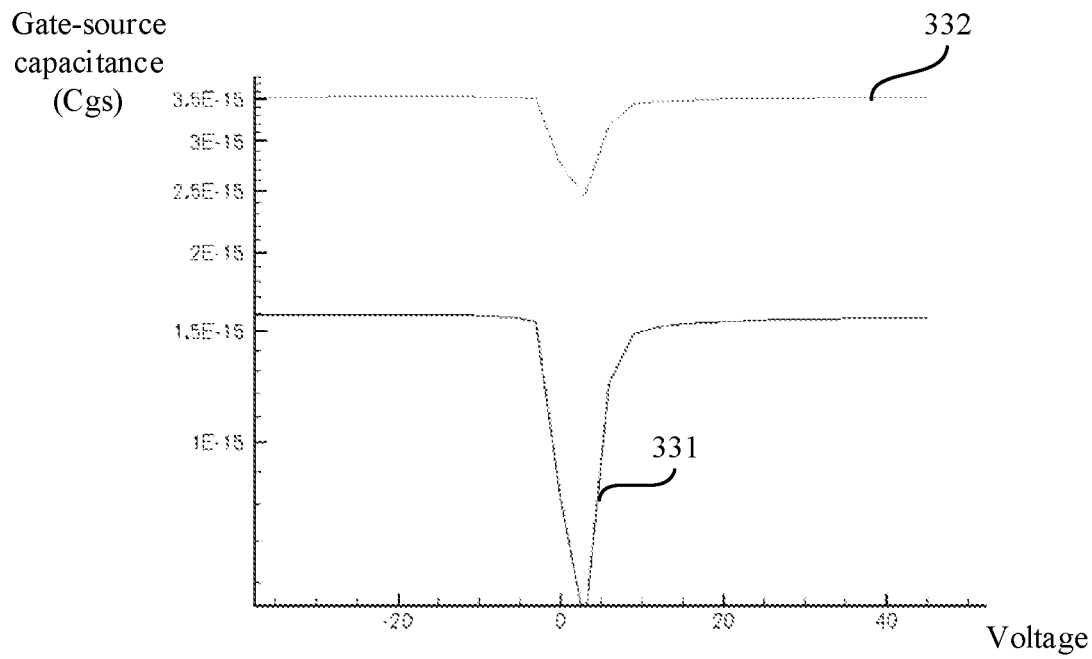
FIG. 3 is a schematic diagram of a relationship between the voltage and the gate-source capacitance of the trench gate device, according to one embodiment of the present application.

In an example, referring to FIG. 2, curve 221 represents an existing trench gate device, and curve 222 represents the trench gate device provided in one embodiment of the present application, wherein the horizontal axis represents the time and the vertical axis represents the current. It can be seen that di/dt of the trench gate device provided in one embodiment of the present application corresponding to the curve 222 is less than di/dt of the existing trench gate device corresponding to the curve 221. Referring to FIG. 3, the horizontal axis represents the voltage, the vertical axis represents Cgs, curve 331 represents the existing trench gate device, and curve 332 represents the trench gate device provided in one embodiment of the present application. It can be seen that Cgs/Cgd (gate-source capacitance/gate-drain capacitance) of the trench gate device provided in one embodiment of the present application is greater than Cgs/Cgd of the existing trench gate device.

Figure 4:
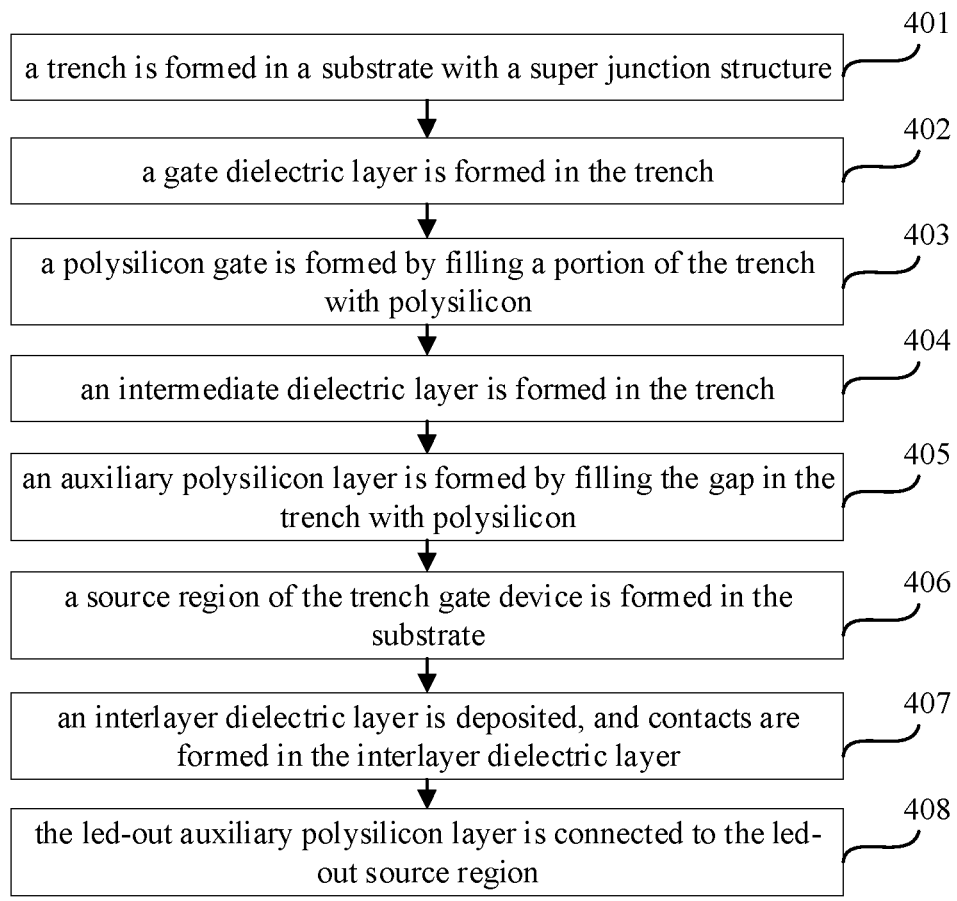
FIG. 4 is a flowchart of a method for manufacturing a trench gate device, according to one embodiment of the present application.

FIG. 4 is a flowchart of a method for manufacturing a trench gate device, according to one embodiment of the present application.

In step 401, a trench is formed in a substrate with a super junction structure.

In step 402, a gate dielectric layer is formed in the trench.

In step 403, a polysilicon gate is formed by filling a portion of the trench with polysilicon.

Figure 5:
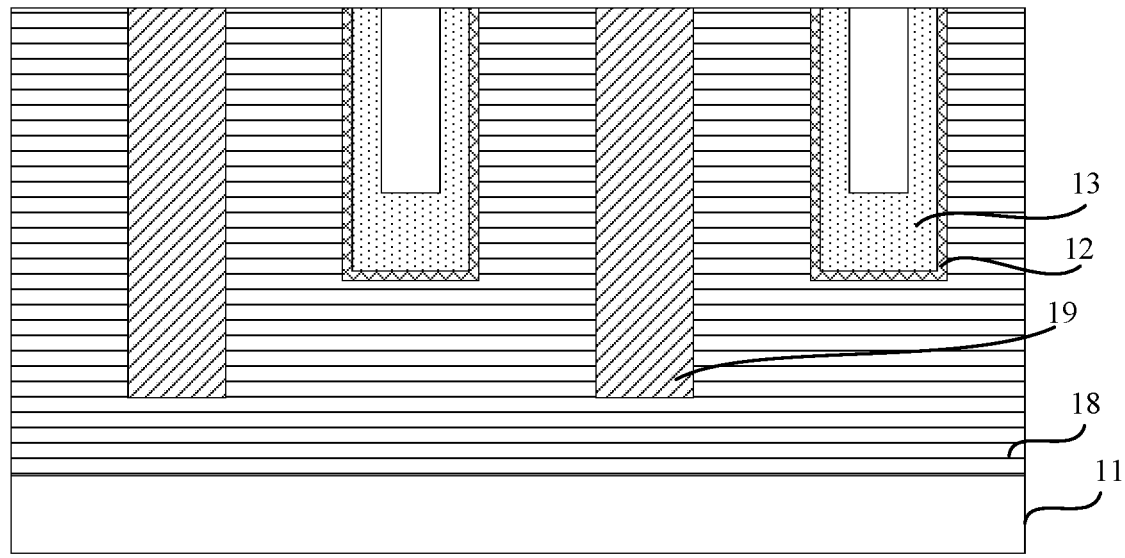
FIG. 5 shows the device cross sectional view after the polysilicon gate is formed, according to one embodiments of the present application.

Referring to FIG. 5, the bottom and sidewalls of the trench are covered by the gate dielectric layer 12. After the first time of polysilicon deposition, the bottom of the trench is filled with polysilicon, there is polysilicon on the sidewalls of the trench, the polysilicon gate 13 is formed, and a gap is formed in the trench.

During the first time of trench filling with polysilicon, a layer of polysilicon is formed on the surface of the substrate.

In step 404, an intermediate dielectric layer is formed in the trench.

Figure 6:
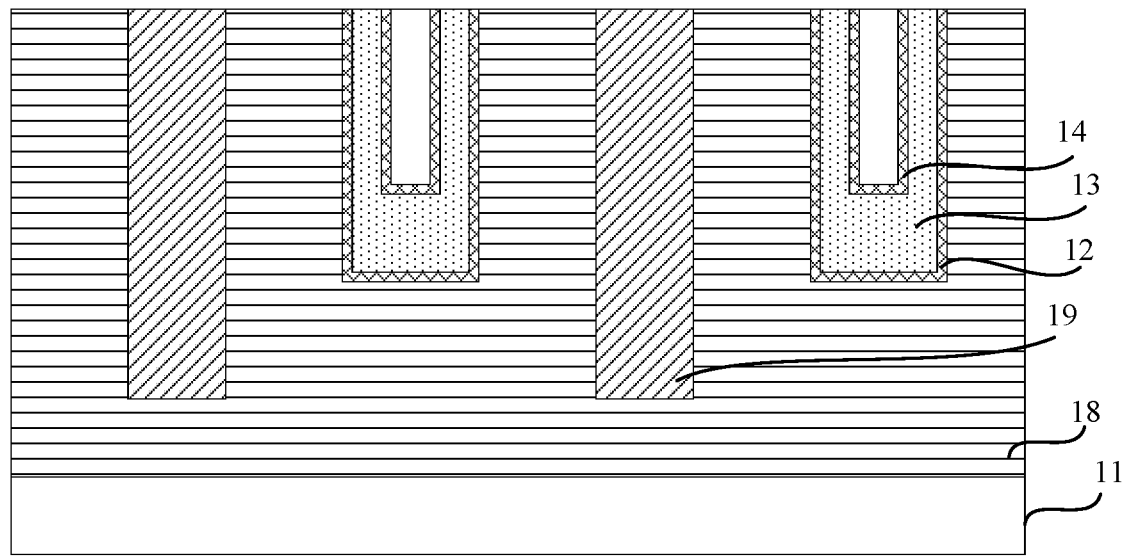
FIG. 6 shows the device cross sectional view after the intermediate dielectric layer is formed, according to one embodiments of the present application.

Referring to FIG. 6, an intermediate dielectric layer 14 is formed in the trench, and the polysilicon gate 13 is located between the intermediate dielectric layer 14 and the gate dielectric layer 12.

During the process of forming the intermediate dielectric layer 14, the intermediate dielectric layer is formed on the surface of the substrate.

In step 405, an auxiliary polysilicon layer is formed by filling the gap in the trench with polysilicon.

Referring to FIG. 6, after the intermediate dielectric layer 14 is formed in the trench, a gap still exists in the trench.

Figure 7:
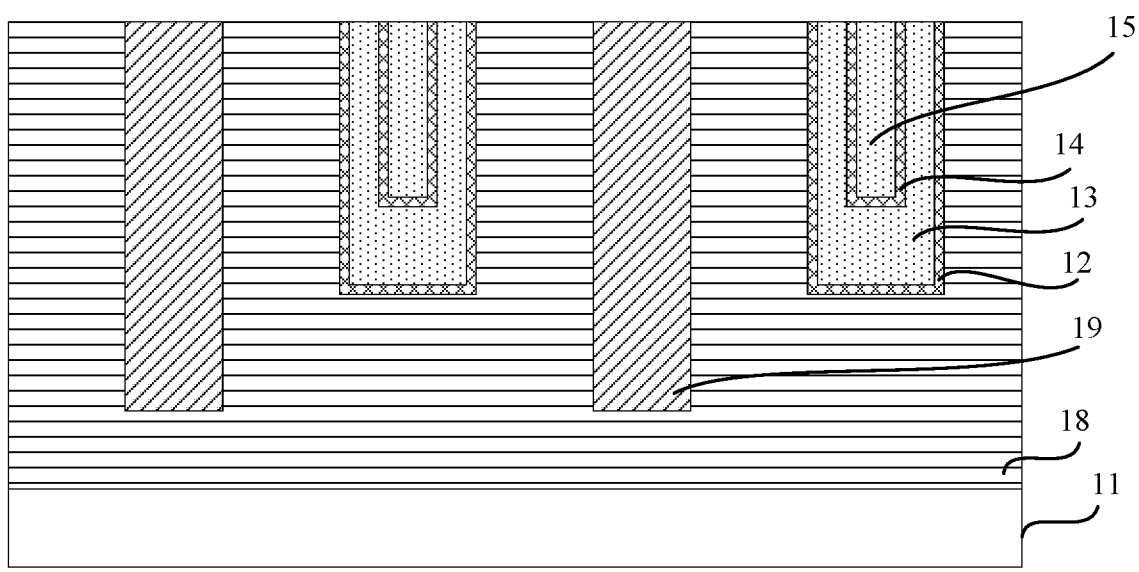
FIG. 7 shows the device cross sectional view after the trench gate is formed, according to one embodiments of the present application.

Trench filling with polysilicon is performed again, referring to FIG. 7, the auxiliary polysilicon layer 15 is formed in the trench, such that the trench is fully filled.

The intermediate dielectric layer 14 is located between the polysilicon gate 13 and the auxiliary polysilicon layer 15.

During the second time of trench filling with polysilicon, a layer of polysilicon is formed on the surface of the substrate.

After the trench gate structure is formed, processes are be performed to remove the polysilicon, the intermediate dielectric layer, and the gate dielectric layer on the surface of the substrate.

In step 406, a source region of the trench gate device is formed in the substrate.

The source region of the trench gate device is at the outer side of the trench gate structure.

In one example, the source regions of the trench gate device are at two sides of the trench gate structure, referring to FIG. 1.

In step 407, an interlayer dielectric layer is deposited, and contacts are formed in the interlayer dielectric layer.

The polysilicon gate, the auxiliary polysilicon layer, and the source region are led out from the contacts, referring to FIG. 1.

In step 408, the led-out auxiliary polysilicon layer is connected to the led-out source region.

In some examples, the led-out auxiliary polysilicon layer is connected to the lead-out source region at a front metal layer.

In summary, the embodiments of the present disclosure solve the problem of a trench gate device provided with a super junction structure is susceptible to electromagnetic interference, and reduce the impact of electromagnetic interference on the performance of the trench gate device provided with the super junction structure by forming the sandwich structure composed of the polysilicon gate, the intermediate dielectric layer, and the auxiliary polysilicon layer.

According to some embodiments of the present application, before the trench used for making the trench gate structure is formed in the substrate, the super junction structure formed by alternately arranged P-type pillar and N-type epitaxial region is formed in the epitaxial layer on the substrate.

According to some embodiments of the present application, the step 401 "a trench is formed in a substrate with a super junction structure" includes the step:

The trench used for forming the trench gate structure is formed in the N-type epitaxial region of the super junction structure in the substrate.

In some examples, a trench region used for forming the trench gate structure is defined above the N-type epitaxial region, and the trench is formed by preforming the processes of etching the substrate.

According to some embodiments of the present application, the gate dielectric layer is an oxide layer.

According to some embodiments of the present application, the material of the intermediate dielectric layer is a dielectric.

In some examples, the material of the intermediate dielectric layer is an oxide, or the material of the intermediate dielectric layer is a non-conductive ceramic material.

According to some embodiments of the present application, the step 403 "a polysilicon gate is formed by filling a portion of the trench with polysilicon" can be implemented in the following mode.

The polysilicon gate is formed by depositing polysilicon until the bottom of the trench to ¼ to ½ of the trench depth is fully filled with polysilicon.

During the process of polysilicon deposition, a polysilicon layer is formed on the sidewalls of the trench. When the polysilicon fully fills the trench from the bottom thereof to the position at ¼ to ½ of the trench depth, a space from the position at ¼ to ½ of the trench depth to the top of the trench is not fully filled by the polysilicon. The formed gap is used to grow the intermediate dielectric layer and the auxiliary polysilicon layer.

According to some embodiments of the present application, the step 406 "a source region of the trench gate device is formed in the substrate" includes:

In step 4061, a well region is formed at the outer side of the trench.

In some examples, after the trench gate structure is formed, the well region is formed in the substrate at the outer side of the trench gate structure by ion implantation processes. In one example, P-wells are formed in the substrate at two sides of the trench gate structure.

In step 4062, the source region of the trench gate device is formed on the top of the well region.

The source region is formed on the top of the well region by ion implantation processes, in one example, an N+ source region is formed on the top of the P-well.

Obviously, the foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

Reference numbers in the drawings are listed in the following:

11: substrate;
12: gate dielectric layer;
13: polysilicon gate;
14: intermediate dielectric layer;
15: auxiliary polysilicon layer;
16: source region;
17: interlayer dielectric layer;
18: first-type epitaxial layer;
19: second-type epitaxial layer;
20: contact; and
21: well region.

What is claimed is:

1. A trench gate device, comprising:
    a substrate;
    a super junction structure on the substrate, the super junction structure comprising a first-type epitaxial layer and a second-type epitaxial layer formed in the first-type epitaxial layer;
    a trench gate structure formed in the first-type epitaxial layer of the super junction structure,
    the trench gate structure comprising a gate dielectric layer covering the bottom and sidewalls of a trench, a polysilicon gate at the inner side of the gate dielectric layer, an intermediate dielectric layer at the inner side of the polysilicon gate, and an auxiliary polysilicon layer at the inner side of the intermediate dielectric layer;

a source region formed at the outer side of the trench gate structure and above the surface of the first-type epitaxial layer of the super junction structure;

an interlayer dielectric layer formed on the trench gate structure and on the source region; and a plurality of contacts formed in the interlayer dielectric layer, wherein the polysilicon gate, the auxiliary polysilicon layer, and the source region are respectively connected to a corresponding one of the plurality of contacts, the plurality of contacts are respective conductors of the polysilicon gate, the auxiliary polysilicon layer, and the source region; and wherein the auxiliary polysilicon layer is connected to the source region by a corresponding one of the plurality of contacts.

2. The trench gate device according to claim 1, further comprising a well region is formed at the outer side of the trench gate structure between the first-type epitaxial layer and the source region.

3. The trench gate device according to claim 1, wherein the first-type epitaxial region is an N-type epitaxial region.

4. The trench gate device according to claim 1, wherein in the trench gate structure, the polysilicon gate filling a space formed from a ¼ to ½ height position of the trench to the bottom of the trench and the polysilicon gate covering sidewalls of the trench; and a gap is formed on the space, the intermediate dielectric layer covering sidewalls of the gap and the auxiliary polysilicon layer filling the gap.

* * * * *